(12) United States Patent
Birang et al.

(10) Patent No.: US 6,399,501 B2
(45) Date of Patent: *Jun. 4, 2002

(54) METHOD AND APPARATUS FOR DETECTING POLISHING ENDPOINT WITH OPTICAL MONITORING

(75) Inventors: Manoocher Birang, Los Gatos; Boguslaw Swedek, San Jose; Nils Johansson, Los Gatos, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/460,529

(22) Filed: Dec. 13, 1999

(51) Int. Cl.[7] .............................................. H01L 21/302
(52) U.S. Cl. ...................... 438/692; 438/690; 438/691; 438/693
(58) Field of Search ................. 438/710, 712, 438/719, 723, 724, 690–693

(56) References Cited

U.S. PATENT DOCUMENTS

| 5,081,796 A | * | 1/1992 | Schultz | 51/165.74 |
|---|---|---|---|---|
| 5,413,941 A | * | 5/1995 | Koos et al. | 437/8 |
| 5,433,651 A | * | 7/1995 | Lustig et al. | 451/6 |
| 5,605,760 A | * | 2/1997 | Roberts | 428/409 |
| 5,640,242 A | * | 6/1997 | O'Boyle et al. | 356/381 |
| 5,672,091 A | * | 9/1997 | Takahashi et al. | 451/6 |
| 5,791,969 A | * | 8/1998 | Lund | 451/5 |
| 5,838,447 A | * | 11/1998 | Hiyama et al. | 356/381 |
| 5,872,633 A | * | 2/1999 | Holzapfel et al. | 356/381 |
| 5,893,796 A | * | 4/1999 | Birang et al. | 451/526 |
| 5,949,927 A | * | 9/1999 | Tang | 385/12 |
| 5,964,643 A | * | 10/1999 | Birang et al. | 451/6 |
| 6,159,073 A | * | 12/2000 | Wiswesser et al. | 451/6 |

FOREIGN PATENT DOCUMENTS

| EP | 881 040 A2 | * 12/1998 |
|---|---|---|
| EP | 881 484 A2 | * 12/1998 |
| JP | 3-234467 | * 10/1991 |

* cited by examiner

Primary Examiner—Benjamin L. Utech
Assistant Examiner—Charlotte A. Brown
(74) Attorney, Agent, or Firm—Fish & Richardson

(57) ABSTRACT

An apparatus, as well as a method, brings a surface of a substrate into contact with a polishing pad that has a window, causes relative motion between the substrate and the polishing pad, and directs a light beam through the window so that the motion of the polishing pad relative to the substrate causes the light beam to move in a path across the substrate. An extreme intensity measurement is derived from a plurality of intensity measurements made as the light beam moves across the substrate. The beam sweeps across the substrate a plurality of times to generate a plurality of extreme intensity measurements, and a polishing endpoint is detected based on the plurality of extreme intensity measurements.

27 Claims, 7 Drawing Sheets

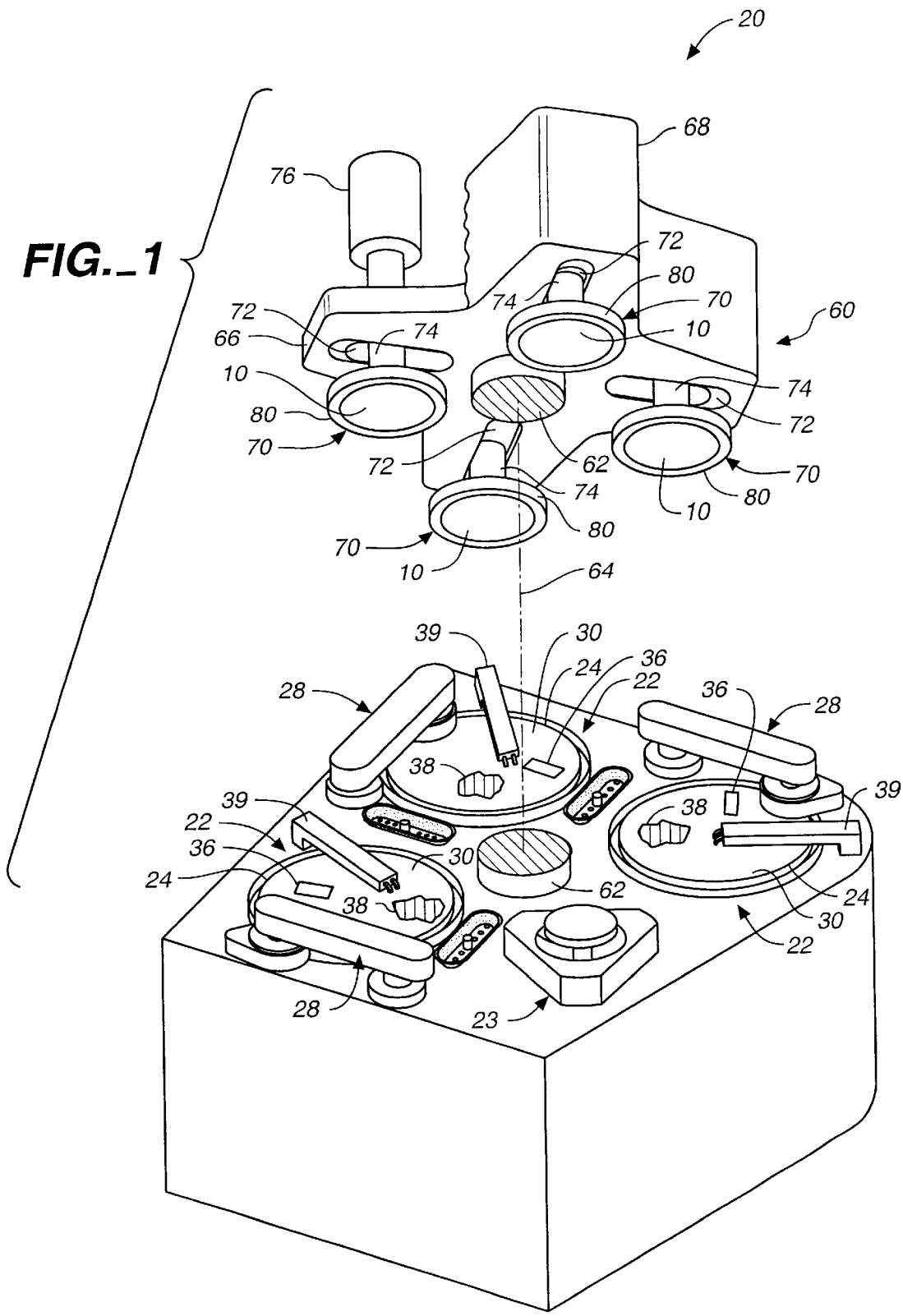
FIG._1

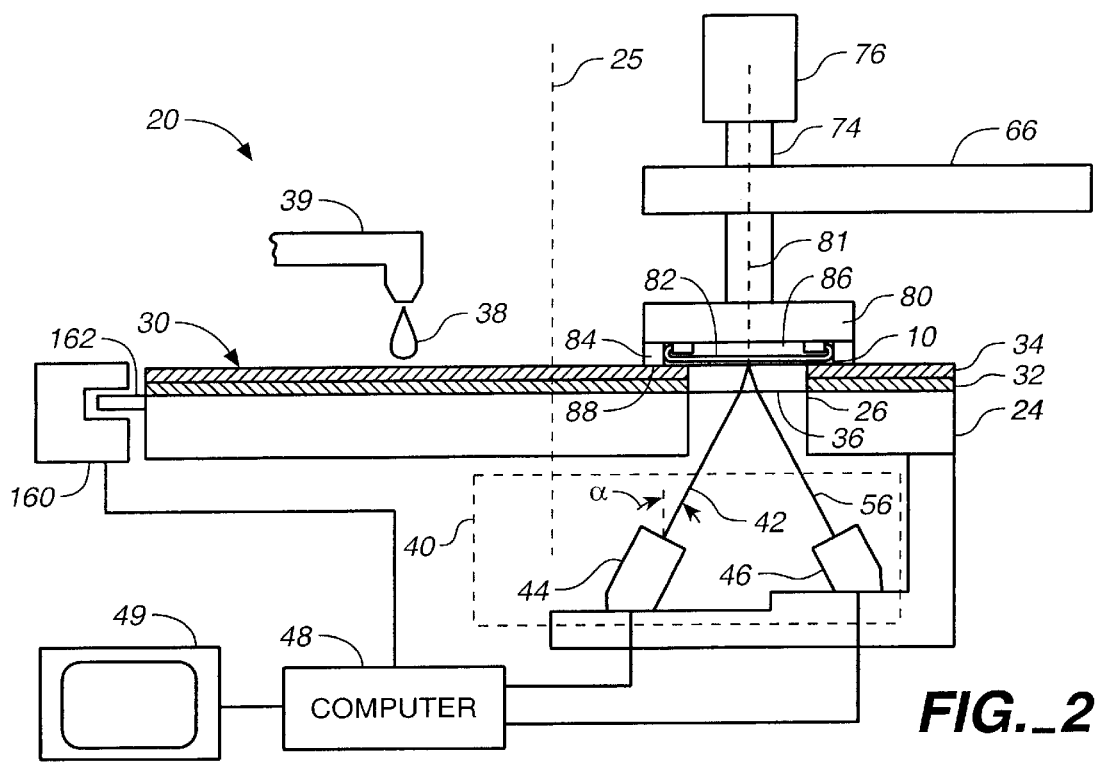
FIG._2
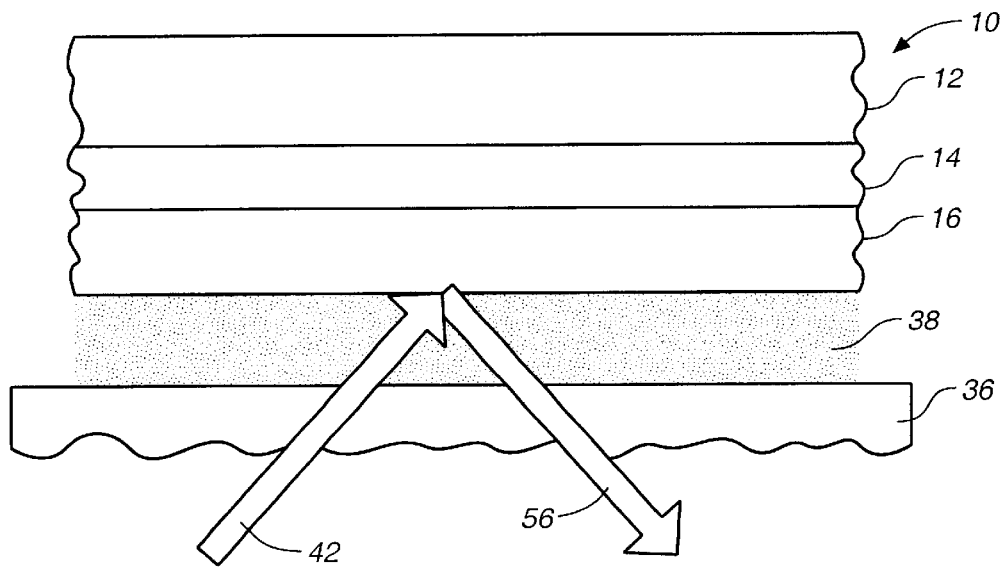
FIG._3

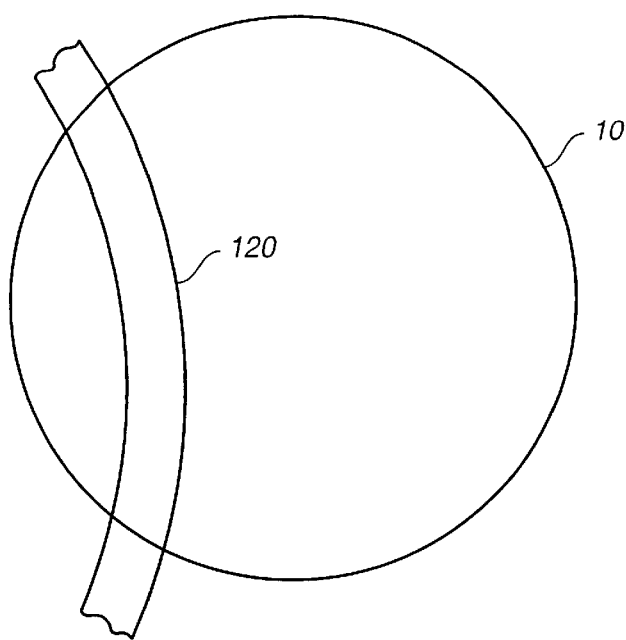
FIG._4
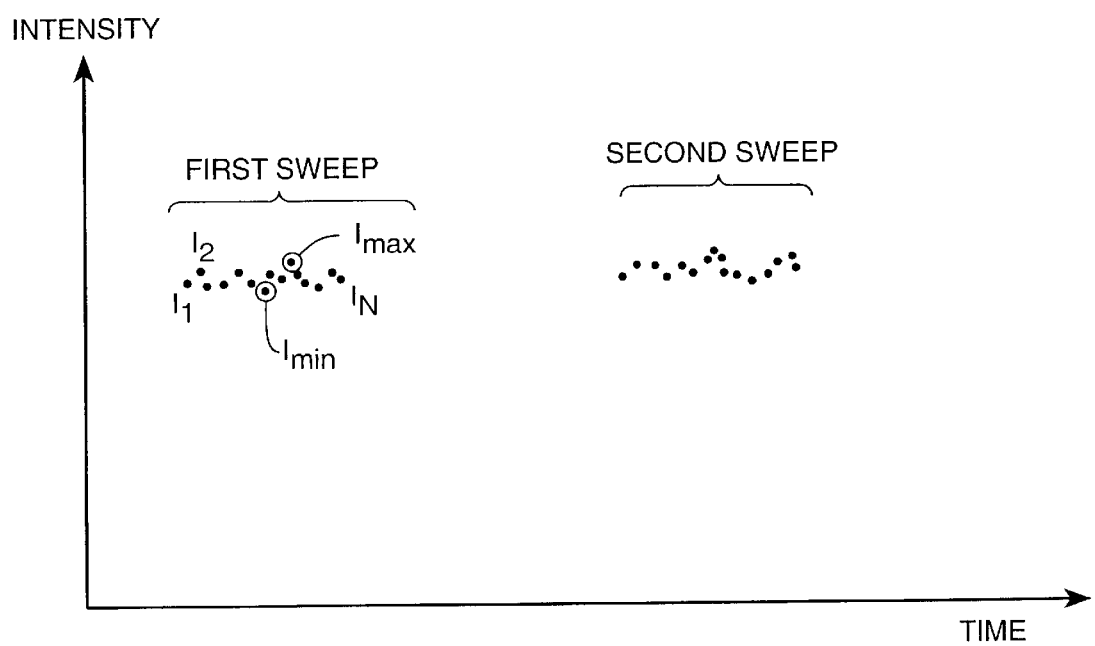
FIG._5

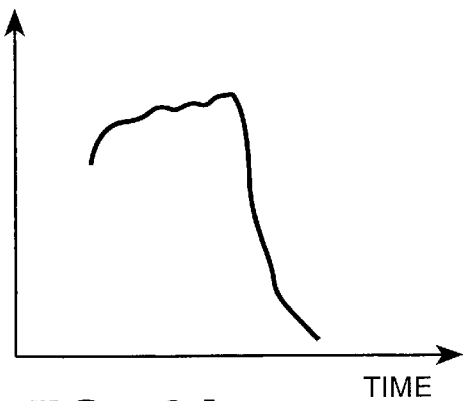
FIG._6A
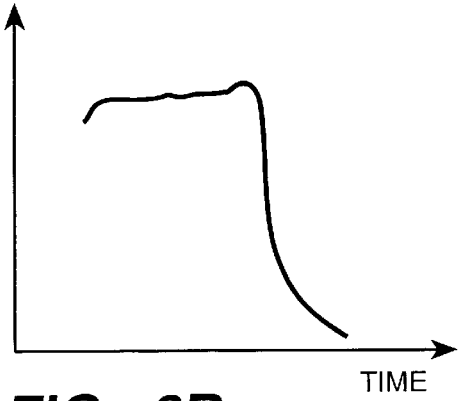
FIG._6B
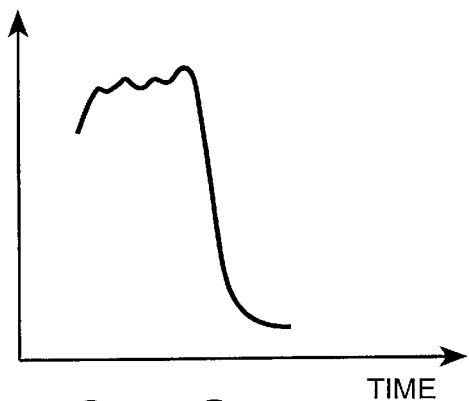
FIG._6C
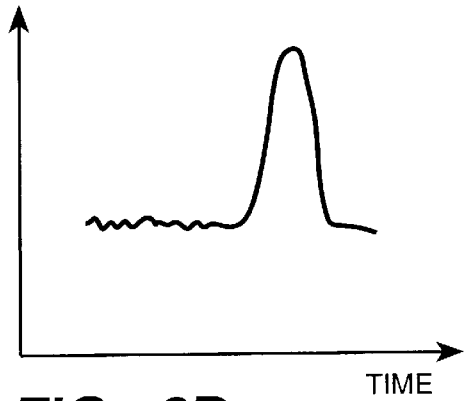
FIG._6D

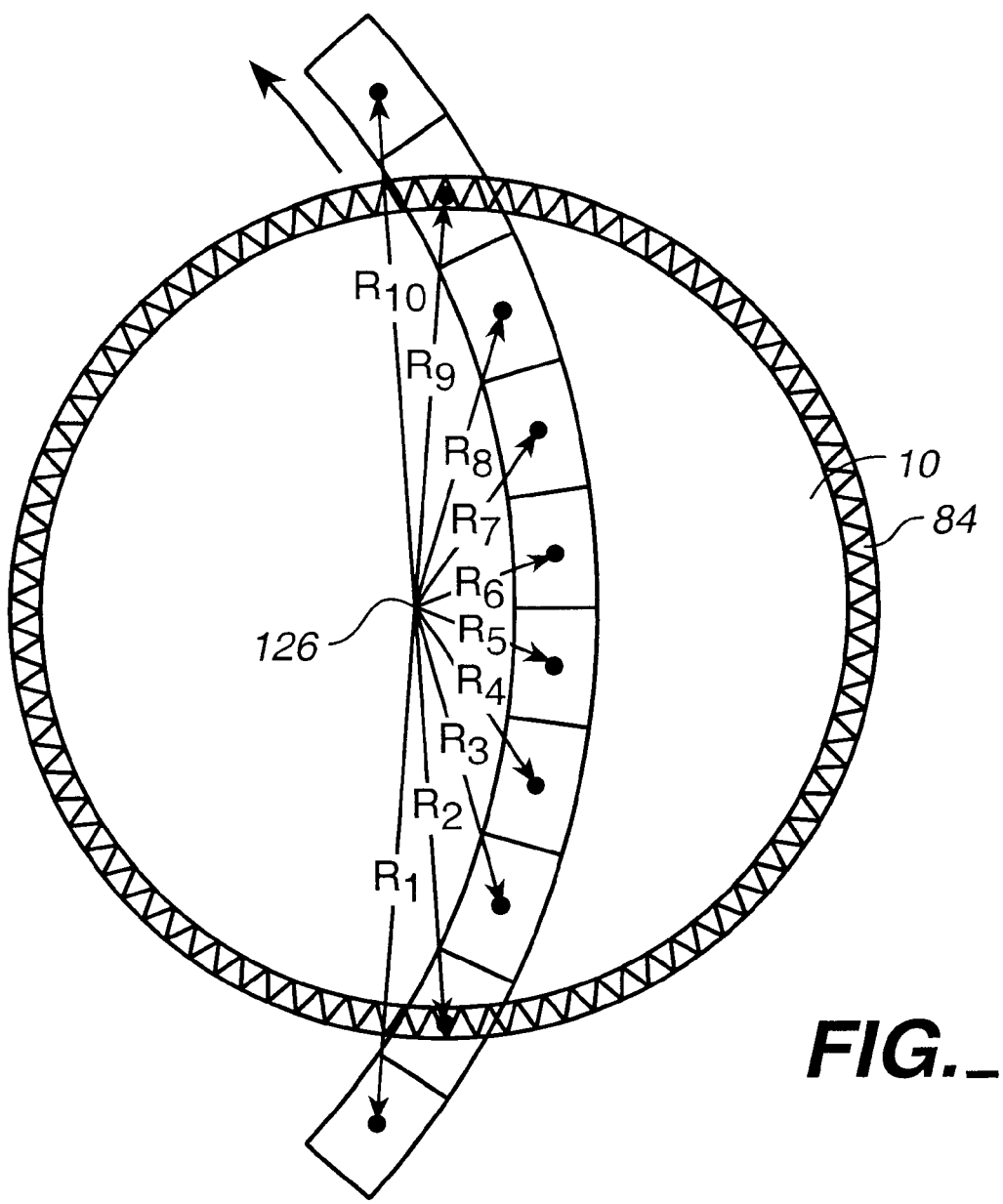
FIG._7

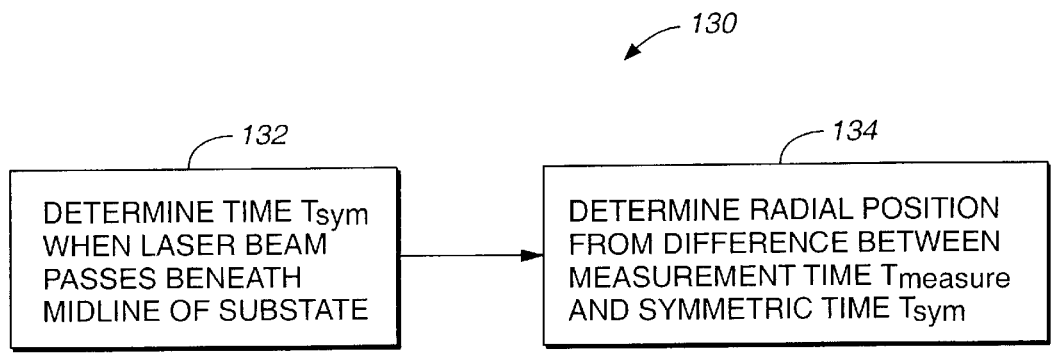
FIG._8A
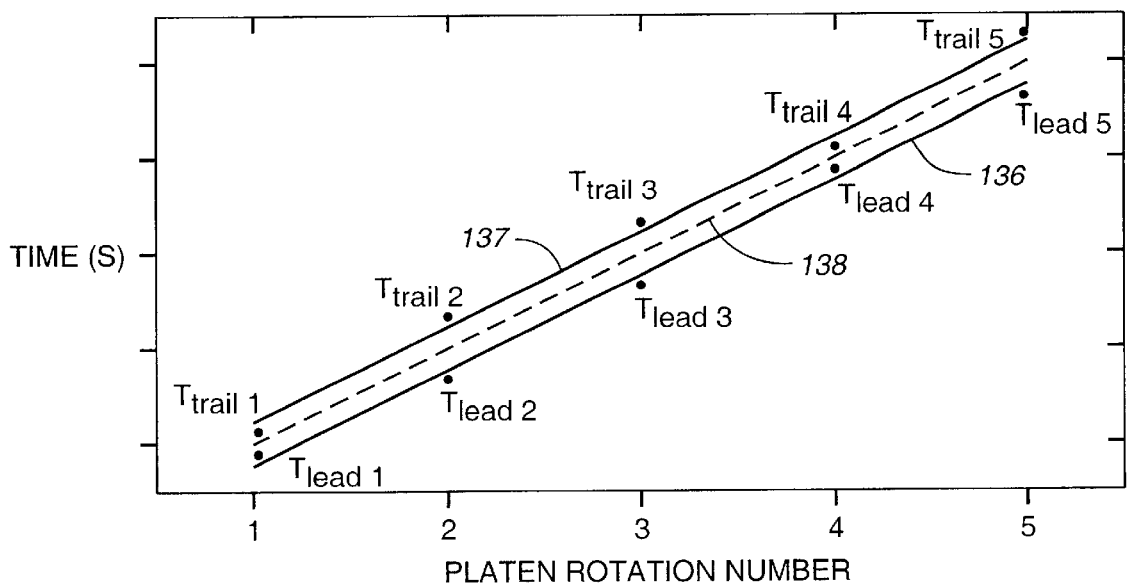
FIG._8B

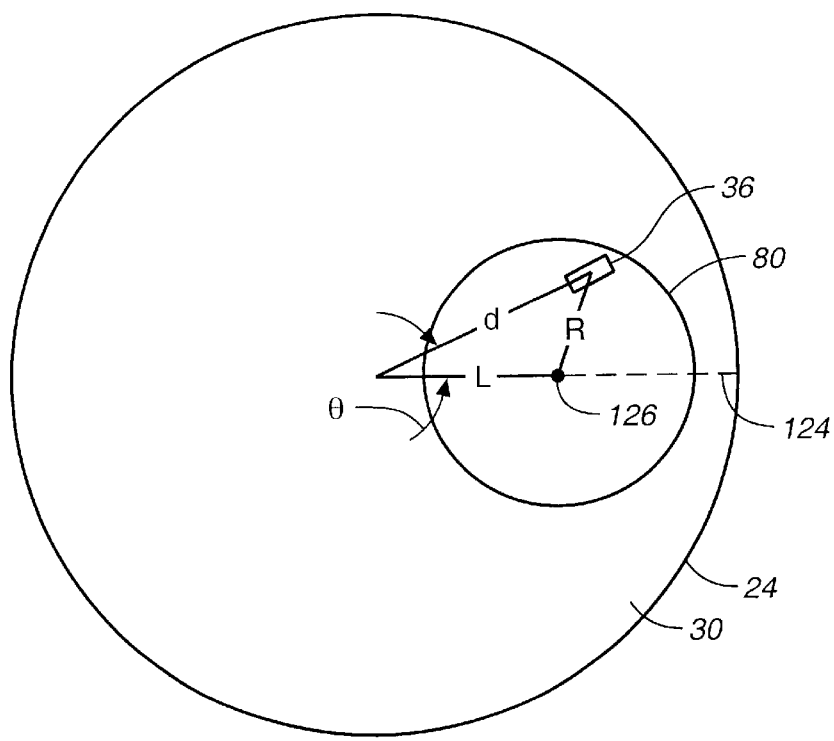
FIG._9
FIG._10

METHOD AND APPARATUS FOR DETECTING POLISHING ENDPOINT WITH OPTICAL MONITORING

BACKGROUND

The present invention relates generally to chemical mechanical polishing of substrates, and more particularly to methods and apparatus for detecting an end-point during a chemical mechanical polishing operation.

An integrated circuit is typically formed on a substrate by the sequential deposition of conductive, semiconductive or insulative layers on a silicon wafer. One fabrication step involves depositing a filler layer over a patterned stop layer, and planarizing the filler layer until the stop layer is exposed. For example, a conductive filler layer may be deposited on a patterned insulative stop layer to fill the trenches or holes in the stop layer. After planarization, the portions of the conductive layer remaining between the raised pattern of the insulative layer form vias, plugs and lines that provide conductive paths between thin film circuits on the substrate.

Chemical mechanical polishing (CMP) is one accepted method of planarization. This planarization method typically requires that the substrate be mounted on a carrier or polishing head. The exposed surface of the substrate is placed against a rotating polishing disk pad or belt pad. The polishing pad may be either a "standard" pad or a fixed-abrasive pad. A standard pad has a durable roughened surface, whereas a fixed-abrasive pad has abrasive particles held in a containment media. The carrier head provides a controllable load, i.e., pressure, on the substrate to push it against the polishing pad. A polishing slurry, including at least one chemically-reactive agent, and abrasive particles if a standard pad is used, is supplied to the surface of the polishing pad.

One problem in CMP is determining whether the polishing process is complete, i.e., whether a substrate layer has been planarized to a desired flatness or thickness. Variations in the initial thickness of the substrate layer, the slurry composition, the polishing pad condition, the relative speed between the polishing pad and the substrate, and the load on the substrate can cause variations in the material removal rate. These variations cause variations in the time needed to reach the polishing endpoint. Therefore, the polishing endpoint cannot be determined merely as a function of polishing time.

One way to determine the polishing endpoint is to remove the substrate from the polishing surface and examine it. For example, the substrate may be transferred to a metrology station where the thickness of a substrate layer is measured, e.g., with a profilometer or a resistivity measurement. If the desired specifications are not met, the substrate is reloaded into the CMP apparatus for further processing. This is a time-consuming procedure that reduces the throughput of the CMP apparatus. Alternatively, the examination might reveal that an excessive amount of material has been removed, rendering the substrate unusable.

More recently, in-situ optical monitoring of the substrate has been performed, e.g., with an interferometer or reflectometer, in order to detect the polishing endpoint. For example, when polishing a metal layer to expose an underlying insulative or dielectric layer, the reflectivity of the substrate will drop abruptly when the metal layer is removed. This drop can be detected to signal the polishing endpoint. Unfortunately, even when there is a sharp change in reflectivity, it may be difficult to determine the proper endpoint.

SUMMARY

In one aspect, the invention is directed to an endpoint detection method for chemical mechanical polishing. In the method, a surface of a substrate is brought into contact with a polishing pad, and relative motion between the substrate and the polishing pad is created. A light beam is directed to contact the surface of the substrate, and the light beam is moved in a path across the substrate surface. An intensity signal produced by the light beam reflecting off the substrate is monitored, and a plurality of intensity measurements are extracted from the intensity signal as the light beam moves across the substrate. A first extreme intensity measurement is derived from the plurality of intensity measurements. The steps are iterated for a plurality of sweeps of the light beam across the substrate to generate a first plurality of extreme intensity measurements, and a polishing endpoint is detected based on the first plurality of extreme intensity measurements.

Implementations of the invention may include the following features. The first extreme intensity measurement is a maximum or minimum intensity measurement from the plurality of intensity measurements. A second extreme intensity measurement may be selected from the plurality of intensity measurements. The minimum intensity measurement for each iteration may be subtracted from the maximum intensity measurement from that iteration to create a plurality of differential intensity measurement. Detecting a polishing endpoint may include determining if criteria associated with either of the first or second plurality of extreme intensity measurements are satisfied. Alternatively, detecting a polishing endpoint may include determining if criteria associated with both the first and second plurality of extreme intensity measurements are satisfied. The substrate may include a filler layer, e.g., a metal layer, disposed over a stop layer, e.g., a dielectric layer, with the filler layer abutting the polishing pad. The polishing endpoint may indicate that the stop layer is at least partially exposed or that the stop layer is substantially exposed. An average intensity may be calculated from the plurality of intensity measurements for each iteration, and the polishing endpoint may be based on the average intensity measurements. The polishing pad may include a window, the light beam may be directed through the window, and the motion of the polishing pad relative to the substrate may cause the light beam to move across the substrate surface. A radial position for each intensity measurement may be determined. The intensity measurements may be divided into a plurality of radial ranges according to the radial positions. An extreme intensity measurement may be selected from the intensity measurements in each of the plurality of radial ranges. Polishing may be stopped at the polishing endpoint, or a polishing parameter, such as a polishing consumable, e.g., a slurry, may be changed at the polishing endpoint.

Advantages of the invention include one or more of the following. A wider range of endpoint detection algorithms are available, making the optical monitoring system useful in a wider range of polishing procedures. The endpoint detection procedure is more robust and lees likely to fail. Endpoint detection during metal polishing is improved. The polishing pressure, polishing speed, chemistry, and slurry composition may be altered when an underlying oxide layer is first exposed, and polishing may be stopped more precisely when the entire oxide and barrier layer have been removed.

Other features and advantages of the invention will to become apparent from the following description, including the drawings and claims.

BRIEF DESCRIPTION OF THE DRAWINGS

FIG. 1 is an exploded perspective view of a chemical mechanical polishing apparatus.

FIG. 2 is a side view of a chemical mechanical polishing apparatus including an optical reflectometer.

FIG. 3 is a simplified cross-sectional view of a substrate being processed, schematically showing a laser beam impinging on and reflecting from the substrate.

FIG. 4 is a schematic view illustrating the path of a laser beneath the carrier head.

FIG. 5 is graph showing intensity measurements from the optical monitoring system in arbitrary intensity units.

FIGS. 6A 6B, 6C and 6D are graphs showing a reflected intensity trace of the metal layer as a function of distance using the average, minimum, maximum, and differential intensity measurements.

FIG. 7 is a schematic view illustrating the radial positions of the intensity measurements on the substrate.

FIG. 8A is a flow chart of a method of determining the radial position of a sampling zone.

FIG. 8B is a graph showing the time at which the laser beam passes beneath the leading and trailing edges of the substrate as a function of the number of rotations of the platen.

FIG. 9 is a schematic view illustrating the calculation of the radial positions of the intensity measurements.

FIG. 10 is a schematic diagram of a data structure to store intensity measurements.

DETAILED DESCRIPTION

Referring to FIGS. 1 and 2, one or more substrates 10 may be polished by a CMP apparatus 20. A description of a similar polishing apparatus 20 may be found in U.S. Pat. No. 5,738,574, the entire disclosure of which is incorporated herein by reference. Polishing apparatus 20 includes a series of polishing stations 22 and a transfer station 23. Transfer station 23 transfers the substrates between the carrier heads, and a loading apparatus.

Each polishing station includes a rotatable platen 24 on which is placed a polishing pad 30. The first and second stations may include a two-layer polishing pad with a hard durable outer surface or a fixed-abrasive pad with embedded abrasive particles. The final polishing station may include a relatively soft pad. Each polishing station may also include a pad conditioner apparatus 28 to maintain the condition of the polishing pad so that it will effectively polish substrates.

A two-layer polishing pad 30 typically has a backing layer 32 which abuts the surface of platen 24 and a covering layer 34 which is used to polish substrate 10. Covering layer 34 is typically harder than backing layer 32. However, some pads have only a covering layer and no backing layer. Covering layer 34 may be composed of an open cell foamed polyurethane or a sheet of polyurethane with a grooved surface. Backing layer 32 may be composed of compressed felt fibers leached with urethane. A two-layer polishing pad, with the covering layer composed of IC-1000 and the backing layer composed of SUBA-4, is available from Rodel, Inc., of Newark, Del. (IC-1000 and SUBA-4 are product names of Rodel, Inc.).

A rotatable multi-head carousel 60 is supported by a center post 62 and is rotated thereon about a carousel axis 64 by a carousel motor assembly (not shown). Center post 62 supports a carousel support plate 66 and a cover 68. Carousel 60 includes four carrier head systems 70. Center post 62 allows the carousel motor to rotate carousel support plate 66 and to orbit the carrier head systems and the substrates attached thereto about carousel axis 64. Three of the carrier head systems receive and hold substrates, and polish them by pressing them against the polishing pads. Meanwhile, one of the carrier head systems receives a substrate from and delivers a substrate to transfer station 23.

Each carrier head system includes a carrier or carrier head 80. A carrier drive shaft 74 connects a carrier head rotation motor 76 (shown by the removal of one quarter of cover 68) to each carrier head 80 so that each carrier head can independently rotate about it own axis. In addition, each carrier head 80 independently laterally oscillates in a radial slot 72 formed in carousel support plate 66.

The carrier head 80 performs several mechanical functions. Generally, the carrier head holds the substrate against the polishing pad, evenly distributes a downward pressure across the back surface of the substrate, transfers torque from the drive shaft to the substrate, and ensures that the substrate does not slip out from beneath the carrier head during polishing operations.

Carrier head 80 may include a flexible membrane 82 that provides a mounting surface for substrate 10, and a retaining ring 84 to retain the substrate beneath the mounting surface. Pressurization of a chamber 86 defined by flexible membrane 82 forces the substrate against the polishing pad. Retaining ring 84 may be formed of a highly reflective material, or it may be coated with a reflective layer to provide it with a reflective lower surface 88. A description of a similar carrier head 80 may be found in U.S. patent application Ser. No. 08/861,260, filed May 21, 1997, the entire disclosure of which is incorporated by reference.

A slurry 38 containing a reactive agent (e.g., deionized water for oxide polishing) and a chemically-reactive catalyzer (e.g., potassium hydroxide for oxide polishing) may be supplied to the surface of polishing pad 30 by a slurry supply port or combined slurry/rinse arm 39. If polishing pad 30 is a standard pad, slurry 38 may also include abrasive particles (e.g., silicon dioxide for oxide polishing).

In operation, the platen is rotated about its central axis 25, and the carrier head is rotated about its central axis 81 and translated laterally across the surface of the polishing pad.

A hole 26 is formed in platen 24 and a transparent window 36 is formed in a portion of polishing pad 30 overlying the hole. Transparent window 36 may be constructed as described in U.S. patent application Ser. No. 08/689,930, filed Aug. 26, 1996, the entire disclosure of which is incorporated herein by reference. Hole 26 and transparent window 36 are positioned such that they have a view of substrate 10 during a portion of the platen's rotation, regardless of the translational position of the carrier head.

An optical monitoring system 40, which can function as a reflectometer or interferometer, is secured to platen 24 generally beneath hole 26 and rotates with the platen. The optical monitoring system includes a light source 44 and a detector 46. The light source generates a light beam 42 which propagates through transparent window 36 and slurry 38 (see FIG. 3) to impinge upon the exposed surface of substrate 10. For example, the light source 44 may be a laser and the light beam 42 may be a collimated laser beam. The light laser beam 42 can be projected from laser 44 at an angle α from an axis normal to the surface of substrate 10, i.e., at an angle α from axes 25 and 81. In addition, if the hole 26 and window 36 are elongated, a beam expander (not illustrated) may be positioned in the path of the light beam to expand the light beam along the elongated axis of the window. Laser 44 may operate continuously. Alternatively, the laser may be activated to generate laser beam 42 during a time when hole 26 is generally adjacent substrate 10.

The CMP apparatus 20 may include a position sensor 160, such as an optical interrupter, to sense when window 36 is near the substrate. For example, the optical interrupter could be mounted at a fixed point opposite carrier head 80. A flag 162 is attached to the periphery of the platen. The point of attachment and length of flag 162 is selected so that it interrupts the optical signal of sensor 160 while window 36 sweeps beneath substrate 10.

In operation, CMP apparatus 20 uses optical monitoring system 40 to determine the amount of material removed from the surface of the substrate, or to determine when the surface has become planarized. A general purpose programmable digital computer 48 may be connected to laser 44, detector 46 and sensor 160. Computer 48 may be programmed to activate the laser when the substrate generally overlies the window, to store intensity measurements from the detector, to display the intensity measurements on an output device 49, to store the intensity measurement, to sort the intensity measurements into radial ranges, and to apply the endpoint detection logic to the measured signals to detect the polishing endpoint.

Referring to FIG. 3, a substrate 10 includes a silicon wafer 12 and an overlying metal layer 16 disposed over an oxide or nitride layer 14. The metal may be copper, tungsten, aluminum, among others. As different portions of the substrate with different reflectivities are polished, the signal output from the detector 46 varies with time. Particularly, when the metal layer 16 has been polished away to expose the oxide or nitride layer 14, the reflectivity of the substrate drops. The time varying output of detector 46 may be referred to as an in-situ reflectance measurement trace (or more simply, a reflectance trace). As discussed below, this reflectance trace may be used to determine the end-point of the metal layer polishing operation.

Generally, the reflected intensity undergoes different changes during polishing for different radial positions on the substrate. This is because the metal layer may be removed at different rates for different portions of the substrate. For instance, the metal layer near the center of the substrate may be removed last, while the metal layer near the perimeter or edge of the substrate may be removed first, or vice versa. However, with the optical monitoring system, the reflection data from the entire wafer is captured at a relatively fine time scale in the order of milliseconds and is available for determination of the polishing endpoint.

Referring to FIG. 4, the combined rotation of the platen and the linear sweep of the carrier head causes window 36 (and thus laser beam 42) to sweep across the bottom surface of carrier head 80 and substrate 10 in a sweep path 120. Referring to FIG. 5, as the laser beam sweeps across the substrate, optical monitoring system 40 generates a series of intensity measurements $I_1, I_2, I_3, \ldots, I_N$ (the number N can differ from sweep to sweep). The sample rate F (the rate at which intensity measurements are generated) of optical monitoring system 40 may be about 500 to 2000 Hertz (Hz), or even higher, corresponding to a sampling period between about 0.5 and 2 milliseconds.

Each time the window sweeps beneath the substrate, the computer 48 extracts a value from the series of intensity measurements $I_1, I_2, I_3, \ldots, I_N$. For example, the series of intensity measurements can be averaged to generate a mean intensity $I_{MEAN}$. Alternately, the computer can extract the minimum intensity $I_{MIN}$ from the series, or the maximum intensity $I_{MAX}$. In addition, the computer can generate an intensity difference $I_{DIF}$ equal to the difference between the maximum and minimum intensities, i.e., $I_{MAX}-I_{MIN}$.

A series of values extracted by computer 48 for a series of sweeps can be stored in memory or non-volatile storage. Referring to FIGS. 6A–6D, this series of extracted values (with one extracted value per sweep) can be assembled and displayed as a function of measurement time to provide the time-varying trace of the reflectivity of the substrate. This time-varying trace may also be filtered to remove noise. FIG. 6A shows a reflectivity trace generated from the mean intensity $I_{MEAN}$ of each sweep, FIG. 6B shows a reflectivity trace generated from the maximum intensity $I_{MAX}$ of each sweep, FIG. 6C shows a reflectivity trace generated from the minimum intensities $I_{MIN}$ of each sweep, and FIG. 6D shows a reflectivity trace generated from the intensity difference $I_{DIF}$ of each sweep.

The overall shapes of the minimum, maximum and average intensity traces may be explained as follows. Initially, the metal layer 16 has some initial topography because of the topology of the underlying patterned layer 14. Due to this topography, the light beam scatters when it impinges the metal layer. As the polishing operation progresses, the metal layer becomes more planar and the reflectivity of the polished metal layer increases. As the bulk of the metal layer is removed, the intensity remains relatively stable. Once the oxide layer begins to be exposed, the overall signal strength declines until the polishing operation is completed. Although the overall shapes of the minimum, maximum and average intensity traces are similar, the different traces have different shapes because different procedures have been used to extract the data points of the traces from the underlying intensity measurements.

The maximum intensity trace, minimum intensity trace and differential intensity trace are particularly useful in the endpoint analysis during metal polishing. Specifically, the minimum intensity trace will tend to begin to drop as soon as the oxide layer is first exposed. In contrast, the maximum intensity trace will tend to begin to drop only after the metal layer is almost entirely removed and the oxide layer is entirely exposed, i.e., after the minimum intensity trace has begun to drop. Thus, the minimum intensity trace can be used for detection of the initial clearing of a spot on the oxide, and the maximum intensity trace can be used for detection of complete metal removal. The average intensity trace will fall somewhere between the minimum and maximum intensity traces. The differential intensity trace provides a measure of the non-uniformity of the its substrate, since it will be largest when the metal has been removed to expose some, but not all, of the underlying oxide.

Given the four intensity traces, a wide variety of endpoint detection algorithms can be implemented. Separate endpoint criteria (e.g., based on local minima or maxima, slope, or threshold values) can be created for each type of trace. Then the endpoint conditions for the various traces can be combined with Boolean logic. For example, polishing could be stopped when the endpoint conditions for either the maximum intensity trace or the differential trace have been met. As another example, polishing could be stopped only when the endpoint conditions for both the minimum intensity trace and the average intensity trace have been met. As noted, any combination of endpoint criteria for two or more of the traces is possible.

The different endpoint traces may also be used to trigger different polishing events. The minimum intensity trace may be used to trigger a change in polishing parameters. For example, the polishing pressure, polishing speed, chemistry, and slurry composition may be altered when the underlying oxide layer is first exposed. Specifically, the system may change from a high-selectivity to a low-selectivity slurry in order to avoid dishing. Polishing may be halted based on the detection of the endpoint in the maximum intensity signal, since this will occur only once the metal has been entirely removed.

The average, minimum, maximum and differential intensity traces may also be created for a plurality of radial ranges on the substrate. The generation of intensity traces for a plurality of radial ranges is discussed in U.S. application Ser. No. 09/184,767, filed Nov. 2, 1998, the entirety of which is incorporated by reference. As previously noted, the combined rotation of the platen and the linear sweep of the carrier head causes window 36 (and thus laser beam 42) to sweep across the bottom surface of carrier head 80 and substrate 10 in a sweep path 120. Turning now to FIG. 7, the radial positions $R_1, R_2, \ldots, R_n$ of the corresponding intensity measurements $I_1, I_2, \ldots, I_n$ can be determined. One way to determine the radial position of an intensity measurement is to calculate the position of the laser beneath the substrate based on the measurement time, the platen rotation rate, and carrier head sweep profile. Unfortunately, the actual platen rotation rate and carrier head sweep profile may not precisely match the polishing parameters. Therefore, a preferred method 130 of determining the radial positions of the intensity measurements is shown in FIG. 8A. First, the time $T_{sym}$ at which laser beam 42 passes beneath a mid-line 124 (see FIG. 5C) of the substrate is determined (step 132). Then the radial positions of the intensity measurements are determined from the time difference between the measurement time $T_{measure}$ and the symmetric time $T_{sym}$ (step 134).

One method of determining the symmetry time $T_{sym}$ is to average the times of the first and last large intensity measurements from each sweep, as these intensity measurements should correspond to the substrate edge. However, this results in some uncertainty in $T_{sym}$ because the positions of the intensity measurements on the substrate are not known.

Referring to FIG. 8B, in order to compute the symmetric time $T_{sym}$ in step 132, computer 48 determines the first and last large intensity measurements from sweep path 120, and stores the corresponding measurement times $T_{lead}$ and $T_{trail}$. These lead and trail times $T_{lead}$ and $T_{trail}$ are accumulated on each sweep to generate a series of lead times $T_{lead1}$, $T_{lead2}, \ldots T_{leadN}$ and trail times $T_{trail1}, T_{trail2}, \ldots T_{trailN}$. Computer 48 stores lead times $T_{lead1}, T_{lead2}, \ldots T_{leadN}$ and the associate number of platen rotations 1, 2, ... N for each leading intensity measurement 96. Similarly, computer 48 stores the trail times $T_{trail1}, T_{trail2}, \ldots T_{trailN}$ and the associated number of rotations 1, 2, ... N of each trailing measurement. Assuming that platen 24 rotates at a substantially constant rate, the times $T_{lead\ 1}, T_{lead\ 2}, \ldots T_{leadN}$ form a substantially linear increasing function (shown by line 136). Similarly, the times $T_{trail1}, T_{trail2}, \ldots T_{trailN}$ also form a substantially linear increasing function (shown by line 137). Computer 48 performs two least square fits to generate two linear functions $T_{lead}(n)$ and $T_{trail}(n)$ as follows:

$$T_{lead}(n)=a_1+(a_2*n)$$

$$T_{trail}(n)=a_3+(a_4*n)$$

where n is the number of platen rotations and $a_1, a_2, a_3$ and $a_4$ are fitting coefficients calculated during the least square fit. Once the fitting coefficients have been calculated, the symmetry time $T_{sym}$ at which laser beam 42 crosses mid-line 124 (shown by phantom line 138) may be calculated as follows:

$$T_{sym} = \frac{a_1+a_3}{2} + \frac{a_2+a_4}{2} \cdot n$$

By using a least square fit over several platen rotations to calculate the symmetry time $T_{sym}$, uncertainty caused by the differences in the relative position of the sampling zone beneath the retaining ring is substantially reduced, thereby significantly reducing uncertainty in the symmetry time $T_{sym}$.

Once computer 48 has calculated the time $T_{sym}$ at which laser beam 42 crosses midline 124, the radial distance $R_1$, $R_2, \ldots R_N$ of each intensity measurement from the center 126 of the substrate are calculated in step 132. Referring to FIG. 10, the radial position may be calculated as follows:

$$R=\sqrt{d^2+L^2-2dL\cos\theta}$$

where d is the distance between the center of the polishing pad and the center of window 36, L is the distance from the center of the polishing pad to the center of substrate 10, and θ is the angular position of the window. The angular position θ of the window may be calculated as follows:

$$\theta=f_{platen} \cdot 2\pi(T_{measure}-T_{sym})$$

where $f_{platen}$ is the rotational rate of the platen (in rpm). Assuming that the carrier head moves in a sinusoidal pattern, the linear position L of the carrier head may be calculated as follows:

$$L=L_0+A \cdot \cos(\omega \cdot T_{measure})$$

where ω is the sweep frequency, A is the amplitude of the sweep, and $L_o$ is the center position of the carrier sweep.

In another embodiment, position sensor 160 could be used to calculate the time $T_{sym}$ when the window crosses midline 124. Assuming that sensor 160 is positioned opposite carrier head 80, flag 162 would be positioned symmetrically across from transparent window 36. The computer 48 stores both the trigger time $T_{start}$ when the flag interrupts an optical beam of the sensor, and the trigger time $T_{end}$ when the flag clears the optical beam. The time $T_{sym}$ may be calculated as the average of $T_{start}$ and $T_{end}$. In yet another embodiment, the platen and carrier head positions could be determined at each measurement time from optical encoders connected to the platen drive motor and radial drive motor, respectively.

Once the radial positions $R_1, R_2, \ldots R_N$ of the intensity measurements have been calculated, some of the intensity measurement may be disregarded. If the radial position R of an intensity measurement is greater than the radius of the substrate, then that intensity measurement includes radiation reflected by the retaining ring or background reflection from the window or slurry. The intensity measurements made beneath the retaining ring can be ignored. This ensures that spurious intensity measurements are not used in the calculation of the thin film layer reflected intensity.

After several sweeps of laser beam 42 beneath the substrate, computer 48 accumulates a set of intensity measurements $I_1, I_2, \ldots I_N$, each associated with a measurement time $T_1, T_2, \ldots T_N$, and a radial position $R_1, R_2, \ldots R_N$. Referring to FIG. 11, as the intensity, time, and radial position measurements are accumulated, the time and intensity measurements are sorted into bins in a data structure 140. Each bin is associated with a radial range on the substrate. For example, intensity measurements made up to 20 mm from the center of the substrate may be placed in a first bin 142, intensity measurements made between 20 and 30 mm from the center of the substrate may be placed in a second bin 144, intensity measurements made between 30 and 40 mm from the center of the substrate may be placed in a third bin 146, and so on. The exact number of bins and the radial ranges of the bins depend upon the information that the user desires to extract. In general, the radial range of each bin may be selected so that a sufficient number of intensity measurements are accumulated in the bin to provide visually meaningful information.

Once the intensity measurements have been sorted into radial ranges, the calculations discussed above to determine the average, minimum, maximum or difference in intensity are performed for each bin, thereby providing four types of intensity traces for each radial range across the surface of the substrate. Separate endpoint criteria (e.g., based on local minima or maxima, slope, or threshold values) can be created for each type of intensity trace in each radial range. The endpoint conditions for the various traces and radial ranges can be combined with Boolean logic. For example, an endpoint may be triggered if the conditions for any of several radial ranges are met, or the endpoint may be triggered only if the conditions for multiple radial ranges are met. Thus, a wide variety of endpoint detection algorithms can be implemented.

The present invention has been described in terms of a preferred embodiment. The invention, however, is not limited to the embodiment depicted and described. Rather, the scope of the invention is defined by the appended claims.

What is claimed is:

1. An endpoint detection method for chemical mechanical polishing, comprising:
    a) bringing a surface of a substrate into contact with a polishing pad;
    b) causing relative motion between the substrate and the polishing pad;
    c) directing a light beam to contact the surface of the substrate;
    d) moving the light beam in a path across the substrate surface that passes through a plurality of zones;
    e) monitoring an intensity signal produced by the light beam reflecting off the substrate;
    f) for each zone in the plurality of zones, extracting a plurality of intensity measurements from the intensity signal as the light beam moves across the substrate;
    g) for each zone in the plurality of zones, selecting a first local extreme intensity measurement from the plurality of intensity measurements in that zone;
    h) iterating steps c)–g) for a plurality of sweeps of the light beam across the substrate and storing the first local extreme intensity measurement from each zone and each sweep to generate a first plurality of extreme intensity measurements; and
    i) detecting a polishing endpoint based on the first plurality of extreme intensity measurements.

2. The method of claim 1, wherein the first local extreme intensity measurement is a maximum intensity measurement from the plurality of intensity measurements in the zone.

3. The method of claim 1, wherein the first local extreme intensity measurement is a minimum intensity measurement from the plurality of intensity measurements in the zone.

4. The method of claim 1, further comprising, for zone in the plurality of zones, selecting a second local extreme intensity measurement from the plurality of intensity measurements in that zone.

5. The method of claim 4, wherein the first local extreme intensity measurement is a maximum intensity measurement and the second local extreme intensity measurement is a minimum intensity measurement from the plurality of intensity measurements.

6. The method of claim 5, wherein detecting a polishing endpoint includes subtracting the minimum intensity measurement for each sweep and zone from the maximum intensity measurement from that sweep and zone to create a plurality of differential intensity measurement.

7. The method of claim 4, wherein detecting a polishing endpoint includes determining if criteria associated with either the first or second plurality of local extreme intensity measurements are satisfied.

8. The method of claim 4, wherein detecting a polishing endpoint includes determining if criteria associated with both the first and second plurality of local extreme intensity measurements are satisfied.

9. The method of claim 1, wherein the substrate includes a filler layer disposed over a stop layer, and the filler layer abuts the polishing pad.

10. The method of claim 9, wherein the polishing endpoint indicates that the stop layer is at least partially exposed.

11. The method of claim 10, wherein the filler layer is a metal layer and the stop layer is a dielectric layer.

12. The method of claim 11, wherein the first local extreme intensity measurement is a minimum intensity measurement from the plurality of intensity measurements.

13. The method of claim 9, wherein the polishing endpoint indicates that the stop layer is substantially exposed.

14. The method of claim 13, wherein the filler layer is a metal layer and the stop layer is a dielectric layer.

15. The method of claim 14, wherein the first local extreme intensity measurement is a maximum intensity measurement from the plurality of intensity measurements.

16. The method of claim 14, further comprising calculating an average intensity from the plurality of intensity measurements for each iteration.

17. The method of claim 16, the polishing endpoint is based on the average intensity measurements.

18. The method of claim 1, wherein the polishing pad includes a window, the light beam is directed through the window, and the motion of the polishing pad relative to the substrate causing the light beam to move across the substrate surface.

19. The method of claim 18, wherein the polishing pad rotates to create relative motion between the substrate and polishing pad.

20. The method of claim 1, wherein the zones correspond to radial ranges from a center of the substrate.

21. The method of claim 1, further comprising stopping polishing at the polishing endpoint.

22. The method of claim 1, further comprising changing a polishing parameter at the polishing endpoint.

23. The method of claim 22, wherein the polishing parameter is a polishing consumable.

24. The method of claim 23, wherein the polishing consumable is a slurry.

25. The method of claim 24, wherein the slurry is changed from a high-selectivity slurry to a low-selectivity slurry.

26. An polishing control method for chemical mechanical polishing, comprising:
    a) bringing a surface of the substrate into contact with a polishing pad;

b) causing relative motion between the substrate and the polishing pad;
c) directing a light beam to contact the surface of the substrate;
d) causing the light beam to move in a path across the substrate surface;
e) monitoring an intensity signal produced by the light beam reflecting off the substrate;
f) extracting a plurality of intensity measurements from the intensity signal as the light beam moves across the substrate;
g) selecting a minimum intensity measurement from the plurality of intensity measurements;
h) selecting a maximum intensity measurement from the plurality of intensity measurements;
i) iterating steps c)–h) for a plurality of sweeps of the light beam across the substrate to generate a plurality of minimum intensity measurements and a plurality of maximum intensity measurements;
j) detecting a first polishing endpoint based on the plurality of minimum intensity measurements; and
k) detecting a second polishing endpoint based on a plurality of maximum intensity measurements.

27. An endpoint detection method for chemical mechanical polishing, comprising:
a) bringing a surface of the substrate into contact with a polishing pad;
b) causing relative motion between the substrate and the polishing pad;
c) directing a light beam to contact the surface of the substrate;
d) causing the light beam to move in a path across the substrate surface;
e) monitoring an intensity signal produced by the light beam reflecting off the substrate;
f) extracting a plurality of intensity measurements from the intensity signal as the light beam moves across the substrate;
g) determining a radial position on the substrate for each intensity measurement;
h) dividing the intensity measurements into a plurality of radial ranges according to the radial position;
i) selecting an extreme intensity measurement from the intensity measurements in each of the plurality of radial ranges.
j) iterating steps c)–i) for a plurality of sweeps of the light beam across the substrate to generate a plurality of extreme intensity measurements in each of the plurality of radial ranges; and
k) detecting a polishing endpoint based on the plurality of extreme intensity measurements in the plurality of radial ranges.

* * * * *